United States Patent [19]

Pennisi

[11] Patent Number: 5,614,858
[45] Date of Patent: Mar. 25, 1997

[54] TIME DELAYED FILTER MONOLITHICALLY INTEGRATABLE

[75] Inventor: Alessio Pennisi, Milan, Italy

[73] Assignee: SGS-Thomson Microelectronics S.r.l., Agrate Brianza, Italy

[21] Appl. No.: 180,213

[22] Filed: Jan. 12, 1994

[30] Foreign Application Priority Data

Jan. 29, 1993 [EP] European Pat. Off. ............ 93830033

[51] Int. Cl.⁶ .................................................. H03K 5/08
[52] U.S. Cl. ........................ 327/311; 327/207; 327/432; 327/552
[58] Field of Search .................................. 327/311, 312, 327/264, 203, 207, 551, 552, 285, 288, 432, 379, 433

[56] References Cited

U.S. PATENT DOCUMENTS

| | | | |
|---|---|---|---|
| 3,845,405 | 10/1974 | Leidich | 307/202 |
| 4,301,383 | 11/1981 | Taylor | 327/432 |
| 4,471,237 | 9/1984 | Kaplan | 307/443 |
| 4,543,494 | 9/1985 | Wakimoto | 307/443 |
| 4,763,028 | 8/1988 | Henry | 307/573 |
| 4,972,096 | 11/1990 | Takeshima et al. | 307/279 |
| 5,028,814 | 7/1991 | Sung et al. | 307/272.2 |
| 5,280,200 | 1/1994 | Tarng | 307/446 |
| 5,362,998 | 11/1994 | Iwamura et al. | 327/379 |

FOREIGN PATENT DOCUMENTS

| 1119114 | 5/1989 | Japan . |
|---|---|---|
| 3239010 | 10/1991 | Japan . |

OTHER PUBLICATIONS

IBM Tech Bulletin, vol. 16, No. 6, Nov. 1973, pp. 1715–1716, "Delay Pulse Generator", D.T. Cox, et al.

*Primary Examiner*—Timothy P. Callahan
*Assistant Examiner*—My-Trang Nu Ton
*Attorney, Agent, or Firm*—David M. Driscoll; James H. Morris; Brett N. Dorney

[57] ABSTRACT

A time delay filter includes at least one field-effect transistor of the MOS type and at least one bipolar transistor having their respective base and gate terminals connected together. The bipolar transistor is coupled to an input terminal through a drive transistor, and the field-effect transistor is coupled to an output terminal. The charge time for the gate capacitance of the field-effect transistor, using the low base current of the bipolar transistor, enables high-frequency noise to be filtered out of input digital signals.

8 Claims, 1 Drawing Sheet

TIME DELAYED FILTER MONOLITHICALLY INTEGRATABLE

BACKGROUND OF THE INVENTION

1. Field of the Invention

This invention relates to filters for removing high-frequency noise from low-frequency signals, and particularly to filters of the time delay type.

2. Discussion of the Related Art

It is well-recognized by persons skilled in the art that high-frequency noise can blanket a transmission signal, unless it is properly filtered out. A number of methods for filtering signals from the outside world, to clear them of any affecting noise, are to be found described in pertinent literature. Of such methods, the most widely employed are those which either provide an analog low-pass filter or a digital low-pass filter, depending on whether the signal to be filtered is an analog or a digital one.

According to the first of the preferred prior art filtering methods, the input signals are applied, via a resistor, to a first terminal of a capacitor having a second terminal connected to a ground potential. The first terminal is also connected to an output terminal of that RC circuit. Assuming the voltage across the capacitor to be null in the absence of any signal, upon application of a signal, an initial transient would occur whereby the voltage across the capacitor varies with inverse proportion to the time constant fixed by the product of the resistive value of the resistor and the capacitance value of the capacitor, approaching, theoretically after an infinite time, the input signal voltage value. The larger the resistance and capacitance values are, the more slowly the circuit will respond to variations in the input signal.

Therefore, short-duration pulses, as are typical of pulsive noise, don't succeed in affecting the capacitance charge of the capacitor in such a manner to produce significant output variations if compared with the values of the signal they overlap. Such pulses are, therefore, filtered out by the RC circuit.

On the other hand, in the latter of the prior art methods, a fixed rate counter is used as a digital low-pass filter, whereby the state of the input digital signal is controlled to remain the same for at least a predetermined time interval. If the logic level setting of the signal changes during that time interval, the counter is reset and counting is resumed only upon reappearance of the logic level. Accordingly, the output signal of the digital type is determined by the counter end-of-count bit. The count is timed not to exceed the standard duration of the logic level of the signals to be filtered for noise. Only those signals which retain the same logic level throughout the counting period are addressed to the output, and therefore, all signals at a higher frequency will be removed.

Both of the prior methods outlined above are effective, but where a large time constant or a long time count must be provided, the circuits comprising low-pass filters involve significant occupation of integration area, when incorporated into an integrated circuit.

Therefore, an object of the invention is to provide an efficient filtering of digital signals affected by noise, while retaining low integration area requirements of the circuit components compared to known filtering circuits.

SUMMARY OF THE INVENTION

The invention overcomes the limitations of the prior art by providing a time delay filter including an input terminal, a bipolar transistor coupled to the input terminal, a field effect transistor coupled to the bipolar transistor, and an output terminal coupled to the field effect transistor. The field effect transistor has a gate capacitance charged by a low base current of the bipolar transistor.

BRIEF DESCRIPTION OF THE FIGURE

The features and advantages of a time delay filter according to the invention will become apparent from the following detailed description of an embodiment thereof, given by way of a non-limiting example with reference to the accompanying drawing.

DETAILED DESCRIPTION

Figure 1:
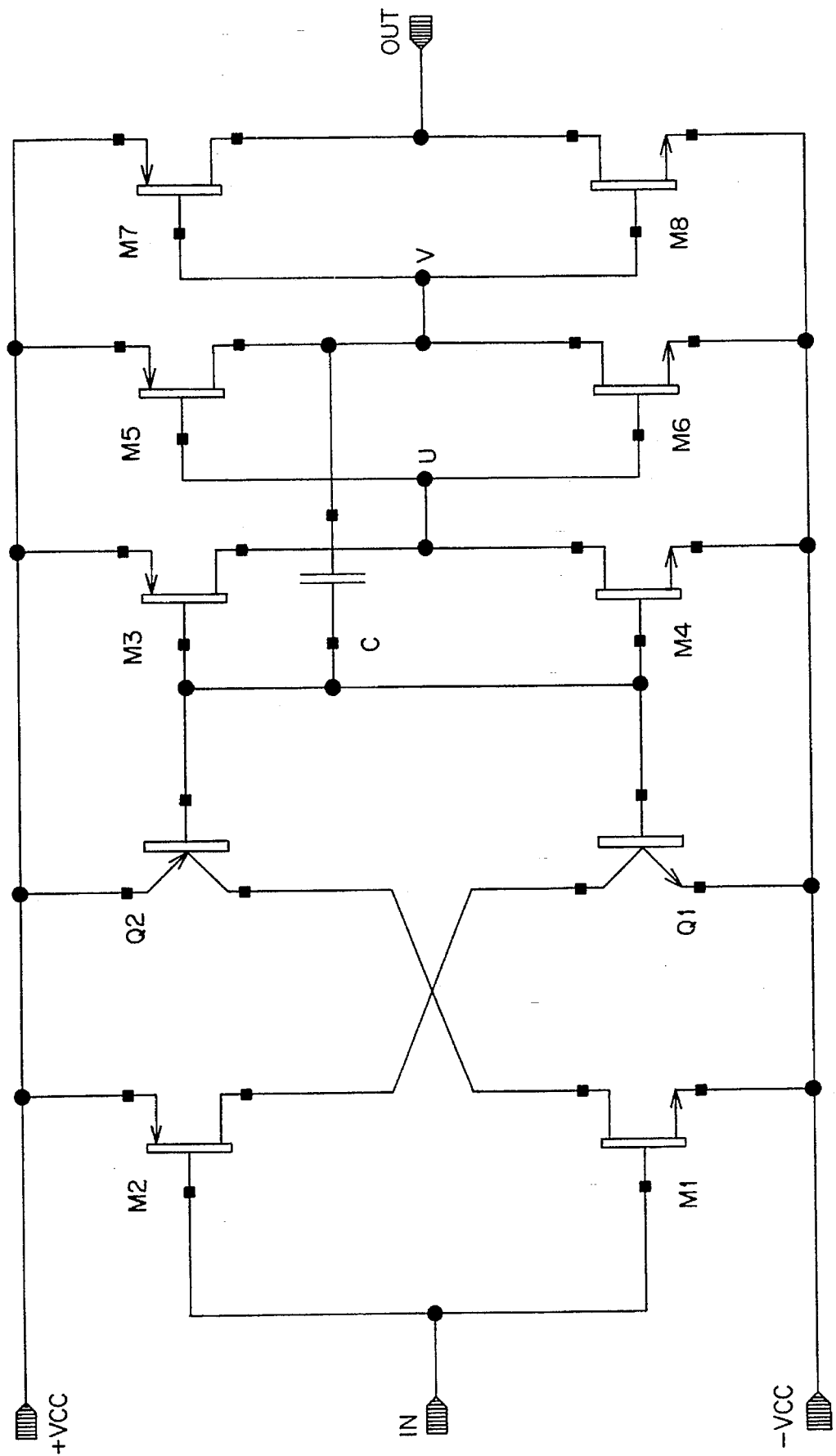
FIG. 1 shows a circuit diagram of a time delay filter according to the present invention and to be implemented in MOS-type technologies.

FIG. 1 shows an improved embodiment of a time delay filter according to the invention, although sufficient noise filtering can also be achieved using less than all of the components included in the schematic. In fact, a time delay filter according to the invention is characterized by the fact that no resistors are employed for fixing the delay. To the contrary, a gate capacitance of a MOS field-effect transistor is charged with a very low current to be derived as base current from a bipolar type transistor. This bipolar transistor is driven by an input signal through a control transistor which may either be a bipolar type or a field-effect type.

The scheme shown in FIG. 1 may be implemented using a mixed or MOS type technology to monolithically integrate both bipolar and CMOS type components onto a single device. In the scheme illustrated, elementary filters according to the invention are provided: one filter including the transistor components M1, Q1 and M3, and one filter including transistor components M2, Q2 and M4. An input signal IN affected by noise is output to the drain terminal of M3, or alternatively M4, following a low-pass filter effect due to the time delay for charging the gate capacitance of such transistors.

The scheme shown in FIG. 1 includes first and second bipolar transistors Q1 and Q2 of the NPN and PNP types, respectively, and first M1, second M2, third M3, and fourth M4 field effect transistors, of which transistors M2 and M3 are P-channel types, and M1 and M4 are N-channel types. The aggregate of these transistors and their connections already forms a further time delay filter which represents an improvement over the conventional filters previously discussed.

The gate terminals of transistors M1 and M2 are connected together and to filter input IN. The collector terminal of transistor Q1, the source terminal of transistor M2, and the source terminal of transistor M3 are connected to the positive pole +VCC of a voltage supply generator, while the source terminals of transistors Q2, M1 and M4 are connected to the negative pole −VCC of the same voltage supply generator.

The emitter terminals of transistors Q1 and Q2 are connected to the drain terminals of transistor M1 and transistor M2 respectively. The base terminals of transistors Q1 and Q2 are connected to the gate terminals of transistor M3 and transistor M4 respectively. The drain terminals of said transistors M3 and M4 are connected together at a circuit node U, which may be an output terminal of the improved filter.

A further improved filter is then provided by the addition of an inverter circuit having an input terminal, connected to the node U, and an output terminal V which may be an output terminal of the filter and is connected, through a capacitor C, to the gate terminals of both transistor M3 and transistor M4. This inverter circuit may be simply formed of a pair of complementary transistors M5 and M6 having their gate terminals connected together at the node U and drain terminals connected together at the node V.

Since at the output V the signal is phase-inverted with respect to the input signal IN, still another improvement is provided by the addition of a second inverter circuit formed of two other complementary transistors M7 and M8 having their drain terminals together connected into an output terminal OUT of the complete filter, as shown in FIG. 1.

The operation of the embodiment shown, of a time delay filter according to the invention, will now be discussed briefly. Conveniently, the input signal has a logic value of 1 when the voltage value is +VCC, and a logic value of 0 when the voltage value is −VCC. An input signal of 0 will turn transistor M1 off and transistor M2 on, which acts as a current generator for the bipolar transistor Q2. The gate capacitance of transistor M4 is charged by the base current of transistor Q2.

When the voltage at the gate terminals of transistors M3 and M4 reaches the value whereby M4 goes on and M3 off, the voltage at the drains of both transistors M3 and M4 becomes zero. The inverter formed by the transistors M5 and M6 outputs a signal of logic level "1" which, through the capacitance C, will reflect on the gates of transistors M3 and M4, boosting their states and, hence, instantaneously to +VCC the gates of M3 and M4.

Conversely, if a signal of logic level "1" appears at the circuit input, M2 goes off and M1 on. This last transistor (M1) acts, in its turn, as a current generator for Q1, which will discharge the capacitance to the gates M3 and M4 by its base current. The voltage on the gates of M3 and M4 decreases slowly until M3 changes from the off to the on condition, and M4 changes from the on to the off condition. The voltage at the drain of M3 and M4 then changes from 0 to 1, and, since M5 and M6 form an inverter, the voltage at the drain of M5 and M6 changes from 1 to 0. This change is then transferred to the gates of M3 and M4, whereby the voltage at the gates of M3 and M4 will become −VCC. The capacitance connected between the gates of M3 and M4 and the gates of M7 and M8 only functions after the transition has been completed to raise the gate voltages of M3 and M4 from the on/off threshold to the +VCC/−VCC voltage.

The advantage of this circuit scheme resides in the considerable area savings compared to the equivalent schemes previously discussed. To produce a 50 ?s delay, for example the following table is applicable:

| CIRCUIT | COMPONENTS | AREA (mils2) |
| --- | --- | --- |
| RC Filter | R = 1 MΩ | 60 |
| | C = 50 pF | 250 |
| | Total | 310 |
| Digital Filter | 8 flip-flops | 70 * 8 = 560 |
| | Total | 760 |
| Inventive Filter | Total | 70 |

While a single embodiment of the invention has been described and illustrated, changes and modifications may be made thereunto without departing from its inventive concept. For example, the polarities and the transistor types could be reversed within the circuit. Alternatively, the field-effect transistors M1 and M2 could be replaced with suitably biased bipolar transistors.

I claim:

1. A time delay filter comprising:

an input terminal;

at least one bipolar transistor coupled to the input terminal, the at least one bipolar transistor having a base terminal:

at least one field-effect transistor, the at least one field-effect transistor having a gate terminal, wherein the base terminal of the bipolar transistor is connected directly to the gate terminal of the field-effect transistor;

an output terminal coupled to the field-effect transistor;

a voltage supply generator having first and second terminals; and at least one drive transistor connected in series with the at least one bipolar transistor between the first and second terminals of the voltage supply generator, wherein the drive transistor has a control terminal forming the input terminal of the time delay filter; and wherein the at least one bipolar transistor includes a PNP transistor, the at least one field-effect transistor includes an N-channel type transistor, and the at least one drive transistor includes a P-channel type field-effect transistor: and wherein: the at least one bipolar transistor includes a first and a second bipolar transistor;

the at least one drive transistor includes a first and a second field-effect transistor;

the at least one field-effect transistor includes a third and fourth field-effect transistor;

each transistor has a first and a second terminal and a control terminal;

the control terminals of the first and second field-effect transistors are connected together at a first circuit node to which the input terminal is coupled;

the first terminal of the second field-effect transistor, the first terminal of the third field-effect transistor, and the second terminal of the first bipolar transistor are connected to the first terminal of the voltage supply generator;

the first terminal of the first field-effect transistor, the first terminal of the fourth field-effect transistor, and the second terminal of the second bipolar transistor are connected to the second terminal of the voltage supply generator;

the first terminal and the control terminal of the first bipolar transistor are connected to the second terminal of the first field-effect transistor and the control terminal of the third field-effect transistor, respectively;

the first terminal and the control terminal of the second transistor are connected to the second terminal of the second field-effect transistor and the control terminal of the fourth field-effect transistor, respectively; and the second terminal of the third and fourth field-effect transistors, respectively, are connected together at a second circuit node to which the output terminal is coupled.

2. A time delay filter as claimed in claim 1 further including a first inverter circuit having at least one input terminal coupled to a linking node between the second terminals of the third and fourth field-effect transistors, respectively, and an output terminal connected, via a capacitor, to the control terminals of the third and fourth field-effect transistors, respectively.

3. A time delay filter as claimed in claim 2 further including a second inverter circuit having at least one input terminal connected to the output terminal of the first inverter circuit and an output terminal forming the output terminal of the time delay filter.

4. A time delay filter as claimed in claim 3 wherein each inverter circuit comprises a pair of complementary MOS transistors connected between the first and second terminals of the voltage supply generator.

5. A time delay filter as claimed in claim 1 wherein the first and second bipolar transistors are of the NPN and PNP type respectively, the second and third field-effect transistors are P-channel MOS transistors, and the first and fourth field-effect transistors are N-channel MOS transistors.

6. A time delay filter comprising:

an input terminal;

at least one bipolar transistor;

at least one field-effect transistor, coupled to the at least one bipolar transistor;

an output terminal coupled to the at least one field-effect transistor;

a voltage supply generator having first and second terminals; and at least one drive transistor connected in series with the at least one bipolar transistor between the first and second terminals of the voltage supply generator, wherein the drive transistor has a control terminal forming an input terminal of the time delay filter; and wherein the at least one bipolar transistor includes a PNP transistor, the at least one field-effect transistor includes an N-channel type transistor, and the at least one drive transistor includes a P-channel type field-effect transistor; and wherein:

the at least one bipolar transistor includes a first and a second bipolar transistor;

the at least one drive transistor includes a first and a second field-effect transistor;

the at least one field-effect transistor includes a third and fourth field-effect transistor;

each transistor has a first and a second terminal and a control terminal;

the control terminals of the first and second field-effect transistors are coupled together at a first circuit node to which the input terminal is coupled;

the first terminal of the second field-effect transistor, the first terminal of the third field-effect transistor, and the second terminal of the first bipolar transistor are coupled to the first terminal of the voltage supply generator;

the first terminal of the first field-effect transistor, the first terminal of the fourth field-effect transistor, and the second terminal of the second bipolar transistor are coupled to the second terminal of the voltage supply generator;

the first terminal and the control terminal of the first bipolar transistor are coupled to the second terminal of the first field-effect transistor and the control terminal of the third field-effect transistor, respectively;

the first terminal and the control terminal of the second transistor are coupled to the second terminal of the second field-effect transistor and the control terminal of the fourth field-effect transistor, respectively; and the second terminal of the third and fourth field-effect transistors, respectively, are coupled together at a second circuit node to which the output terminal is coupled.

7. A time delay filter as claimed in claim 6 wherein the first and second bipolar transistors are of the NPN and PNP type respectively, the second and third field-effect transistors are P-channel MOS transistors, and the first and fourth field-effect transistors are N-channel MOS transistors.

8. A monolithically integrated time delay filter comprising:

first and second bipolar transistors;

first, second, third and fourth field-effect transistors, each transistor having a first and a second terminal and a control terminal;

wherein the control terminals of the first and second field-effect transistors are connected to an input terminal of the time delay filter;

wherein the first terminal of the second field-effect transistor, the first terminal of the third field-effect transistor, and the second terminal of the first bipolar transistor are connected to a first terminal of a voltage supply generator;

wherein the first terminal of the first field-effect transistor, the first terminal of the fourth field-effect transistor, and the second terminal of the second bipolar transistor are connected to a second terminal of the voltage supply generator;

wherein the first terminal and control terminal of the first bipolar transistor are connected to the second terminal of the first field-effect transistor and the control terminal of the third field-effect transistor, respectively;

wherein the first terminal and the control terminal of the second transistor are connected to the second terminal of the second field-effect transistor and the control terminal of the fourth field-effect transistor, respectively; and wherein the second terminal of the third field-effect transistor and the second terminal of the fourth field-effect transistor are connected to an output terminal of the time delay filter.

* * * * *